United States Patent [19]

Sugahara et al.

[11] Patent Number: 5,355,022
[45] Date of Patent: Oct. 11, 1994

[54] STACKED-TYPE SEMICONDUCTOR DEVICE

[75] Inventors: Kazuyuki Sugahara; Natsuo Ajika; Toshiaki Ogawa; Toshiaki Iwamatsu; Takashi Ipposhi, all of Hyogo, Japan

[73] Assignee: Mitsubishi Denki Kabushiki Kaisha, Tokyo, Japan

[21] Appl. No.: 936,390

[22] Filed: Aug. 28, 1992

[30] Foreign Application Priority Data

Sep. 10, 1991 [JP] Japan .................................. 3-230246
Jun. 23, 1992 [JP] Japan .................................. 4-164593

[51] Int. Cl.$^5$ ...................... H01L 27/02; H01L 23/48
[52] U.S. Cl. ................................... 257/768; 257/506; 257/757
[58] Field of Search ............... 257/686, 723, 724, 754, 257/755, 757, 760, 768, 777, 506

[56] References Cited

U.S. PATENT DOCUMENTS

| | | | |
|---|---|---|---|
| 4,398,341 | 8/1983 | Geipel, Jr. et al. | 257/757 |
| 4,612,083 | 9/1986 | Yasumoto et al. | 156/633 |
| 4,800,177 | 1/1989 | Nakamae | 257/757 |
| 4,826,787 | 5/1989 | Muto et al. | 437/208 |
| 4,845,544 | 7/1989 | Shimizu | 257/756 |
| 4,939,568 | 7/1990 | Kato et al. | 357/75 |
| 4,983,251 | 1/1991 | Haisma et al. | 156/630 |
| 5,003,375 | 3/1991 | Ichikawa | 257/757 |
| 5,025,301 | 6/1991 | Shimizu | 257/755 |
| 5,170,242 | 12/1992 | Stevens et al. | 257/757 |
| 5,189,500 | 2/1993 | Kusunoki | 359/72 |

FOREIGN PATENT DOCUMENTS

| | | |
|---|---|---|
| 0168815A3 | 1/1986 | European Pat. Off. |
| 0238066A2 | 9/1987 | European Pat. Off. |
| 60-3148 | 1/1985 | Japan |
| 3-16787 | 3/1991 | Japan |
| 3108776 | 5/1991 | Japan |

OTHER PUBLICATIONS

J. Electrochem. Soc., vol. 138, No. 8, Aug. 1991, The Electrochemical Society, Inc., S. 404C, Abstract 503.
J. Electrochem. Soc., vol. 138, No. 8, Aug. 1991, The Electrochemical Society, Inc., S. 402C, Abstract 468.
"Silicon-on-Insulator Wafer Bonding-Wafer Thinning Technological Evaluations", by J. Haisma et al., Japanese Journal of Applied Physics, vol. 28, No. 8, Aug. 1989, pp. 11426-1443.
"Silicon Nitride Direct Bonding", by M. S. Ismail et al., Electronics Letters, vol. 26, No. 14, Jul. 5, 1990, pp. 1045-1046.
"High-Quality Thin-Film SOI Technology Using Wafer Bonding and Selective Polishing for VLSI's", by T. Matsushita et al., IEEE Transactions on Electron Devices, vol. 36, No. 11, Nov. 1989, p. 2621.
Lasky et al., "Silicon-on-Insulator (SOI) by Bonding and Etch-Back", IEEE IEDM, 1985, pp. 684-687.
Hashimoto et al., "Low Leakage SOIMOSFETs Fabricated Using a Wafer Bonding Method," Extended Abstracts of the 21st Conference on Solid State Devices and Materials, Tokyo 1989, pp. 89-92.
Proceedings of the 5th Crystal Optics Symposium of the Crystal Optics Sectional Committee of the Japan Society of Applied Physics, 1988, pp. 31-34.
Butsuri, "SOI," Applied Physics, vol. 54, No. 12, 1985, pp. 1274-1283.
"Fabrication of Bonded SOI with Silicon Layer", Extended Abstracts of the 38th Spring Meeting 1991, Japan Society of Applied Physics and Related Societies.

*Primary Examiner*—Rolf Hille
*Assistant Examiner*—David Ostrowski
*Attorney, Agent, or Firm*—Lowe, Price, LeBlanc & Becker

[57] ABSTRACT

In a method of manufacturing a stacked-type semiconductor device, firstly, a first semiconductor substrate having a first device formed thereon is covered with an interlayer insulating layer and a planarized polycrystalline silicon layer is formed on the interlayer insulating layer. The first semiconductor substrate and a second semiconductor substrate are joined together by putting the surface of the polycrystalline silicon layer in close contact with the surface of a refractory metal layer formed on the second semiconductor substrate, applying thermal treatment at 700° C. or below and changing the refractory metal layer to silicide.

10 Claims, 18 Drawing Sheets

STACKED-TYPE SEMICONDUCTOR DEVICE

BACKGROUND OF THE INVENTION

1. Field of the Invention

The present invention relates generally to a method of manufacturing a stacked-type semiconductor device and, more particularly, relates to technique in which a stacked type structure is formed by bonding a semiconductor substrate having a device formed thereon and another semiconductor substrate together.

2. Description of the Background Art

In order to realize an increased integration density and a larger number of functions of a semiconductor device, attempts have been made to manufacture a stacked-type semiconductor device (so called "three dimensional circuit element") in which circuit elements are stacked up. One example is a method of forming a stacked-type structure by directly bonding two semiconductor substrates each having devices formed thereon, with an insulator interposed therebetween.

FIGS. 17 to 21 show a first example of the background art method for manufacturing a stacked-type semiconductor device. Firstly, referring to FIG. 17, a MOS (Metal Oxide Semiconductor) type field effect transistor having the n conductivity type (hereinafter referred to as "nMOSFET") is formed of a p-type single crystal silicon substrate 1, an insulation oxide film 2, a gate electrode 3 formed of polycrystalline silicon, a conductive interconnection 4 formed of tungsten silicide and source/drain regions 5 doped with n-type impurities. A BPSG (Boro-Phospho Silicate Glass) film 6 including a large amount of boron and phosphorus is deposited on the nMOSFET by CVD and annealed in an atmosphere including oxygen at 900° C. for 30 minutes to planarize BPSG film 6 as shown in FIG. 18.

Then, as shown in FIG. 19, a hole having a cross section 10 μm square is made in BPSG film 6 on conductive interconnection 4, where tungsten 7 is filled. Tungsten 7 is formed by selective CVD. The manufacturing process in a wafer state of pMOSFET (A) is thus completed.

Then, a pMOSFET (B) is formed by the same process as that shown in FIGS. 17 to 19. The pMOSFET (B) includes an insulation oxide film 12 formed on an n-type single crystalline silicon substrate 11, a gate electrode 13, a conductive interconnection 14 and source/drain regions 15 doped with p-type impurities, with tungsten 17 formed in a BPSG film 16 coinciding with tungsten 7 when placed face to face with nMOSFET (A) as shown in FIG. 20.

At last, as shown in FIG. 21, nMOSFET (A) and pMOSFET (B) are put together by pressing, facing each other, and thermally treated in an electric furnace at 900° C. for 20 minutes to be stuck together. In this way, nMOSFET (A) and pMOSFET (B) are completely insulated and isolated from each other. As a result, a C (Complementary) MOSFET is constructed with a stacked-type structure including two layers.

A description will now be made of a second example of the background art method for manufacturing a stacked-type semiconductor device with reference to FIGS. 22 to 26. This background art example of manufacturing processes of a stacked-type semiconductor device was disclosed in Japanese Patent Publication No. 3-16787.

In this background art example, firstly, referring to FIG. 22, a first layer of MOSFET is formed, including an insulation oxide film 22, a gate electrode 23, a conductive interconnection 24 and source/drain regions 25 on a single crystalline silicon substrate 21. Then, an interlayer insulating film 26 is deposited by CVD and the surface thereof is planarized by applying a resist and etching back. An aperture 27 having a cross section 1.3 μm square, extending to single crystalline silicon substrate 21, is made in part of interlayer insulating film 26 in order to form a single crystalline silicon layer on interlayer insulating film 26, which has the same crystal axis as that of single crystalline silicon substrate 21.

Thereafter, as shown in FIG. 23, polycrystalline silicon 28a is filled in aperture 27 by CVD and etching back. Polycrystalline silicon 29 having a thickness of 0.5 μm is formed over interlayer insulating film 26 by CVD. After that, polycrystalline silicon 29 is irradiated with an argon laser beam 30 having a beam diameter of 100 μm moving in a direction indicated by the arrow in the figure at a scanning rate of 25 cm/s. Polycrystalline silicon 29 becomes fused silicon 31 by the irradiation with the argon laser beam 30 and solidified and recrystallized after the irradiation is completed. When fused silicon 31 is solidified, then epitaxial growth is caused in the lateral direction with single crystalline silicon substrate 21 and fused polycrystalline silicon 28a serving as a seed, polycrystalline silicon 28a becomes single crystallized silicon 28, and polycrystalline silicon 29 on interlayer insulating film 26 becomes single crystallized silicon 32 having the same crystal axis as that of single crystalline silicon substrate 21 (see FIG. 24).

Then, referring to FIG. 25, single crystallized silicon 32 is patterned into single crystallized silicon 33 where a MOS transistor is to be formed and single crystallized silicon 34 on aperture 27 by photolithography and etching technique. Thereafter, a MOS transistor in a second layer is formed on single crystallized silicon 33 in the same way as that of the MOS transistor in the first layer (see FIG. 26). The MOS transistor in the second layer includes an insulation oxide film 42, a gate electrode 43, a conductive interconnection 44 and source/drain regions 45.

The background art methods of manufacturing the stacked-type semiconductor devices above had problems as described below.

In the first example of the background art method, it was necessary to apply thermal treatment at 1000° C. or above since nMOSFET (A) and pMOSFET (B) were joined together by sticking BPSG films 6 and 16 together. As a result, there was disadvantageously caused thermal diffusion of the impurities doped in source/drain regions 5 and so on making up the device which had already been formed before the joining process, having an adverse effect on the device characteristics.

There was also the following problem, which was peculiar to formation of the CMOSFET by putting the nMOSFET and the pMOSFET face to face with each other according to the first example of the background art method described above.

P-type single crystalline silicon substrate 1 and n-type single crystalline silicon substrate 11 both must have a certain strength as they serve as substrates for supporting the devices during the manufacturing processes. Accordingly, they must be 500 to 600 μm thick. In the photolithography of the manufacturing processes, a reduction projection alligner, which is mainly used at present, carries out mask alignment using a helium neon laser beam having a wavelength of 6428 Å as a probe beam. Use of the helium neon laser beam as the probe beam enables mask alignment with positional accuracy of 0.3 μm. However, according to the conventional manufacturing method of the stacked-type semiconductor device above, the helium neon laser cannot be used as the probe beam in the process of joining the substrates together since each substrate is at least 500 μm thick and the beam with the wavelength of 6428 Å cannot be transmitted through such a substrate. Accordingly, in the process of joining the substrates together it was necessary to use infrared rays with a wavelength of 2.0 μm capable of being transmitted through a wafer of 500 μm in positioning each single crystalline silicon substrate. As a beam having a long wave length must be used, the positional accuracy in joining the single crystalline silicon substrates together was normally ±5 μm, and in the order of ±2 μm at best. Therefore, even if the devices on the single crystalline silicon substrates were formed with a design rule of 0.8 to 1 μm, the size of contact for connecting the substrates must be above 10 μm making an allowance for the joining. Accordingly, in forming a CMOS by sticking the substrates together, it was impossible to increase the integration density of the elements up to the present LSI's level.

The second background art method had a problem that, as it included a step of fusing and recrystallizing the polycrystalline silicon layer by the argon laser beam, an intense heat was generated, causing an adverse effect on the characteristics of the devices which had already been formed in the previous processes.

Another possible method of manufacturing a stacked-type semiconductor device like the second background art method described above may be to fix a silicon substrate on the interlayer insulating layer by an adhesive material such as an epoxy resin and form a device on the silicon substrate (for example, see IEDM 85, pp. 684–686). However, interfacial states are generated in the interface between the silicon substrate and the interlayer insulating layer, so that the potential of the silicon substrate is changed, degrading the device characteristics.

It might also be possible to apply technique used in forming an SOI (Silicon on Insulator) MOSFET in which an oxide film and a silicon substrate or two or more silicon substrates are stuck together (see "Extended Abstracts of the 21st Conference on Solid State Devices and Materials, Tokyo, 1989, pp. 89–92" and "Proceedings of the 5th Crystal Optics Symposium of Crystal Optics Sectional Committee of the Japan Society of Applied Physics, pp. 31–34"). However, the process of joining the oxide film and the silicon substrate or the two or more silicon substrates also requires thermal treatment in the approximate range of 900° C. to 1100° C., making it impossible to avoid the adverse effect on the device characteristics.

SUMMARY OF THE INVENTION

An object of the present invention is to provide a method of manufacturing a stacked-type semiconductor device where two or more semiconductor substrates can be joined together with a high accuracy by thermal treatment at such a low temperature as will not cause an adverse effect on a device already formed in the previous process.

Another object of the present invention is to improve the accuracy of joining devices in upper and lower layers of a stacked-type semiconductor device and increase its integration density.

In the method of manufacturing a stacked-type semiconductor device according to the present invention for achieving the former object above, firstly, a first device is formed on a main surface of a first semiconductor substrate and the first device is covered with an interlayer insulating layer. Thereafter, the interlayer insulating layer is covered with a layer including silicon crystal and then the layer including the silicon crystal is planarized. Then, a refractory metal layer is formed on a main surface of a second semiconductor substrate. The surface of the refractory metal layer and the planarized surface of the layer including the silicon crystal are brought in close contact with each other and thermally treated at 700° C. or below. This thermal treatment changes the refractory metal layer to silicide, thereby joining the first semiconductor substrate and the second semiconductor substrate together.

Also, the above-described object can also be achieved by forming a silicon nitride film layer including a higher percentage of nitrogen than $Si_3N_4$ on the main surface of the second semiconductor substrate, putting the silicon nitride film layer in close contact with the planarized layer including silicon crystal and applying thermal treatment at 700° C. or below.

In accordance with each manufacturing method above, since the first semiconductor substrate and the second semiconductor substrate can be joined together at a relatively low temperature of 700° C. or below, it is possible to avoid degradation of the device characteristic, which is involved in thermal diffusion of doped impurities into the first device already formed before the joining process.

A method of manufacturing a stacked-type semiconductor device for achieving the latter object above includes a process of predetermined grinding of the other main surface of the second semiconductor device and forming a second device on the other main surface after joining the first semiconductor substrate and the second semiconductor substrate together in accordance with either of the manufacturing methods described above for achieving the former object.

Also, the method of manufacturing the stacked-type semiconductor device according to the present invention includes a method where a main surface of the second semiconductor substrate is fixed on the first semiconductor substrate according to either of the manufacturing methods for achieving the former object above, and the a device is formed on the other main surface of the second semiconductor substrate.

In accordance with each manufacturing method described above, the second semiconductor substrate can be used as a supporting substrate and a second device can be formed on a semiconductor layer obtained by polishing the first semiconductor substrate. Accordingly, the semiconductor layer where the second device is to be formed can be made thin, enabling positioning with a high accuracy using a helium neon laser beam as a probe beam. As a result, positioning of the semiconductor substrates to be stuck together becomes relatively easy and its integration density can be increased.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

A method of manufacturing a stacked-type semiconductor device according to a first embodiment of the present invention will now be described with reference to FIGS. 5 to 10.

Figure 5:
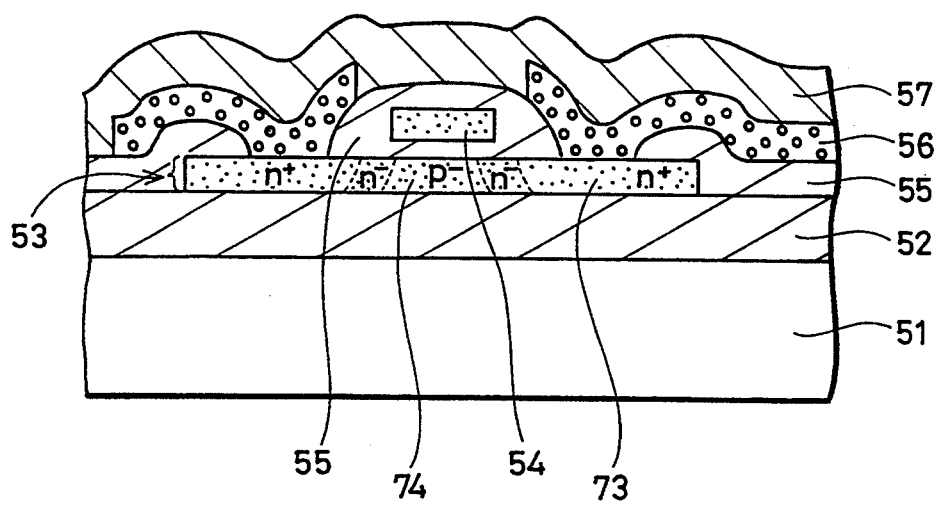
FIGS. 5, 6, 7, 8, 9 and 10 are cross-sectional views showing in order each process in the method of manufacturing the stacked-type semiconductor device according to the first embodiment of the present invention.

In this embodiment, referring to FIG. 5, firstly, a first semiconductor layer 53 formed of single crystalline silicon having a thickness of about 1000 Å is formed over a main surface of a first semiconductor substrate 51 formed of single crystalline silicon with a first insulating layer 52 having a thickness of about 5000 Å interposed therebetween. Such a structure having a thin semiconductor layer formed on an insulating layer is called "SOI (Silicon on Insulator) structure" and formed by SIMOX (Separation by Implanted Oxygen) (see Ouyou Butsuri (Applied Physics), vol. 54, No. 12, pp. 1274–1283, 1985).

According to SIMOX, the above-described SOI structure can be obtained by implanting oxygen ions into the main surface of first semiconductor substrate 51 with an accelerating voltage of about 180 KV and a dose of about $2 \times 10^{18}/cm^2$ and annealing the entire wafer at about 1350° C. for about 1 hour. As the thickness of first semiconductor layer 53 immediately after the annealing is in the order of 2000 Å, it is adjusted to be in the order of 1000 Å by oxidizing the surface of first semiconductor layer 53 in an atmosphere of vapor steam at about 950° C. and removing the oxide film by etching. Thereafter, the first semiconductor layer 53 is patterned so that it remains only in an active region.

Subsequently, a nMOSFET as a first device is completed by forming n-type source/drain regions 73 and a p-type channel region 74 in the first semiconductor layer 53 and, further forming a gate electrode 54, an insulation oxide film 55 and a conductive interconnection 56. The structure having a cross section shown in FIG. 5 is obtained by further covering the entire wafer with an interlayer insulating layer 57 by CVD.

An outline of processes for forming this nMOSFET is as follows. Firstly, an oxide film is formed having a thickness of about 300 Å on first semiconductor layer 53 by thermal oxidation at 950° C. A silicon nitride film ($Si_3N_4$) is then deposited having a thickness of about 500 Å on the oxide film by applying low pressure CVD at 780° C. The silicon nitride film is then removed by photolithography and etching, leaving the silicon nitride on a region to be an active layer. Thereafter, boron for isolation is implanted into an isolation region with an accelerating voltage 10 KV and a dose of $9 \times 10^{13}/cm^2$, with a resist film used when the silicon nitride film was removed being left as it is. Then, after removing the resist, first semiconductor layer 53 except the region to be the active layer is changed to an oxide film by oxidation in an atmosphere of vapor steam at 950° C. After that, boron is implanted into the first semiconductor layer 53 with an accelerating voltage of 20 KV and a dose of $5 \times 10^{11}/cm^2$, causing the first semiconductor layer 53 to have the p conductivity type.

Subsequently, after forming a gate oxide film having a thickness of 300 Å in an atmosphere of vapor steam at 950° C., polycrystalline silicon is deposited on it, and furthermore, boron is implanted into the polycrystalline silicon with 20 KV and $1 \times 10^{16}/cm^2$. Then, this polycrystalline silicon is patterned to form gate electrode 54. Phosphorus is then implanted with 50 KV and $1 \times 10^{13}/cm^2$ to form an n$^-$ region in the first semiconductor layer 53 and n-type source/drain regions 73 are formed by further implanting arsenic with 50 KV and $2 \times 10^{15}/cm^2$. At this time, insulation oxide film 55 covering gate electrode 54 prevents the arsenic from being implanted into the n$^-$ region and channel region 74 of the first semiconductor layer 53. The n$^-$ region is provided for mitigating the field strength of a portion of the drain region close to the channel region and has a so-called LDD (Lightly Doped Drain) structure.

Interlayer insulating layer 57 formed of an oxide film having a thickness of 5000 Å is provided on thus formed nMOSFET serving as the first device by CVD.

A description will now be made of a process of sticking a second semiconductor substrate on the first semiconductor substrate having the nMOSFET formed as described above.

Figure 6:
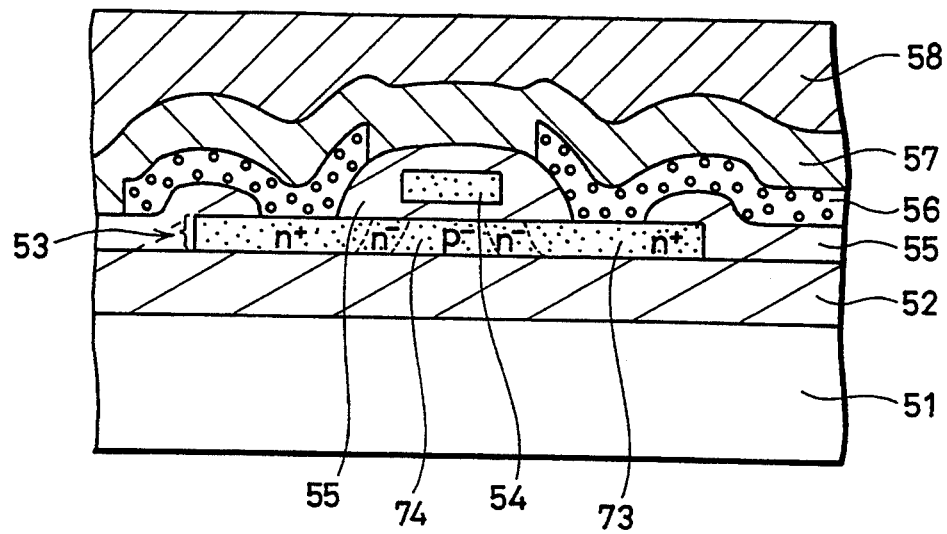

Firstly, polycrystalline silicon having a thickness of about 1 μm is deposited over the entire surface of interlayer insulating layer 57 covering the nMOSFET as the first device, the surface thereof is planarized by rigid grinding to form a polycrystalline silicon layer 58 as shown in the cross-sectional view of FIG. 6.

The rigid grinding method used in the planarization step of polycrystalline silicon layer 58 is a method of carrying out a grinding process by abutting the grinding face of a hard pad having a planar grinding surface against the face of the workpiece to be ground. Because the conventional method of rotating a soft pad to grind the workpiece with its periphery is easily affected by the variation in the hardness of the surface to be ground of the workpiece, a favorable planarization was difficult to obtain. In contrary, the method of rigid grinding is not so affected by the variation in the hardness of the face of the workpiece to be ground to result in a ground workpiece face of a desired planarization.

Furthermore, an oxide film 60 having a thickness of about 1000 Å is formed on a main surface of a second semiconductor substrate 59 formed of single crystalline silicon. On the upper surface thereof is formed a refractory metal layer 61 formed of a tungsten film having a thickness of about 3000 Å by sputtering.

Figure 7:
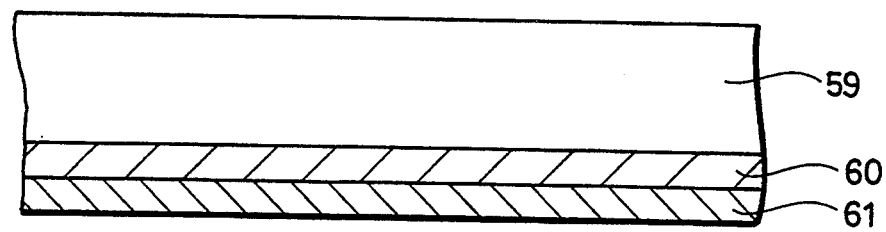
Figure 7:
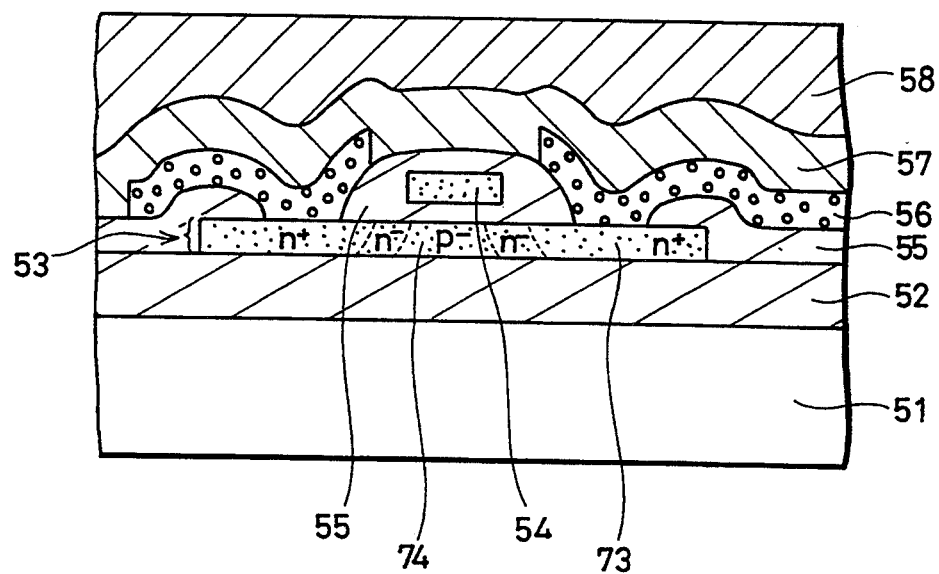

Subsequently, refractory metal layer 61 and polycrystalline silicon layer 58 are placed facing to each other as shown in FIG. 7 and, furthermore, put in close contact with each other and thermally treated in an atmosphere of nitrogen at 650° C. for 20 minutes. This thermal treatment causes refractory metal layer 61 formed of tungsten and polycrystalline silicon layer 58 to chemically react to produce a refractory metal silicide layer 62. As a result, the first semiconductor wafer and second semiconductor wafer are joined together (see FIG. 8).

Figure 8:
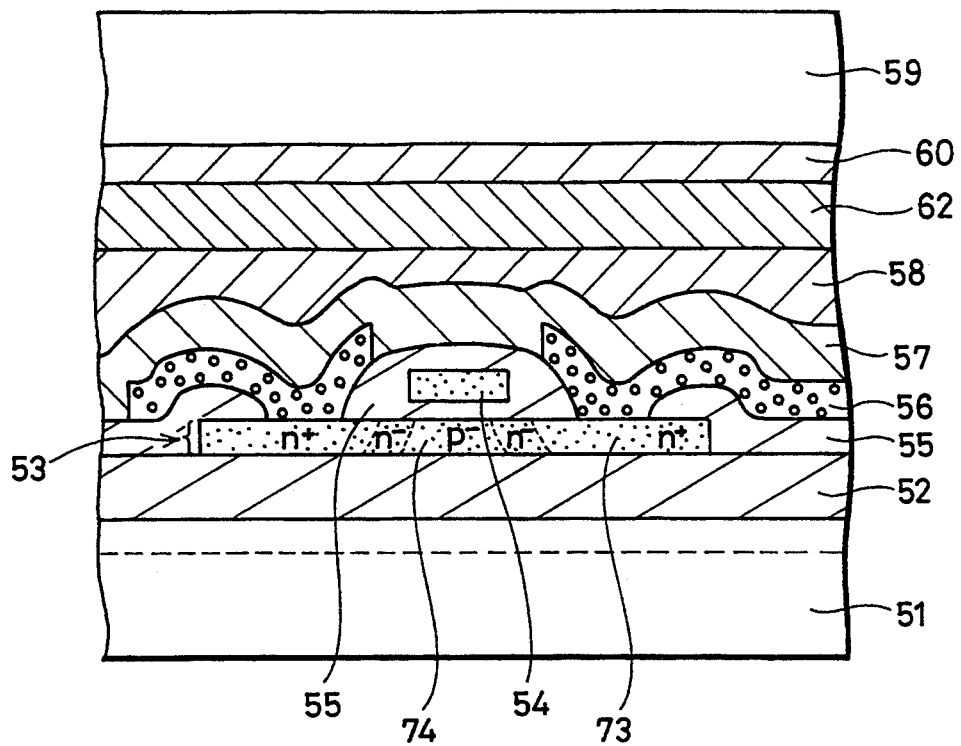
Figure 9:
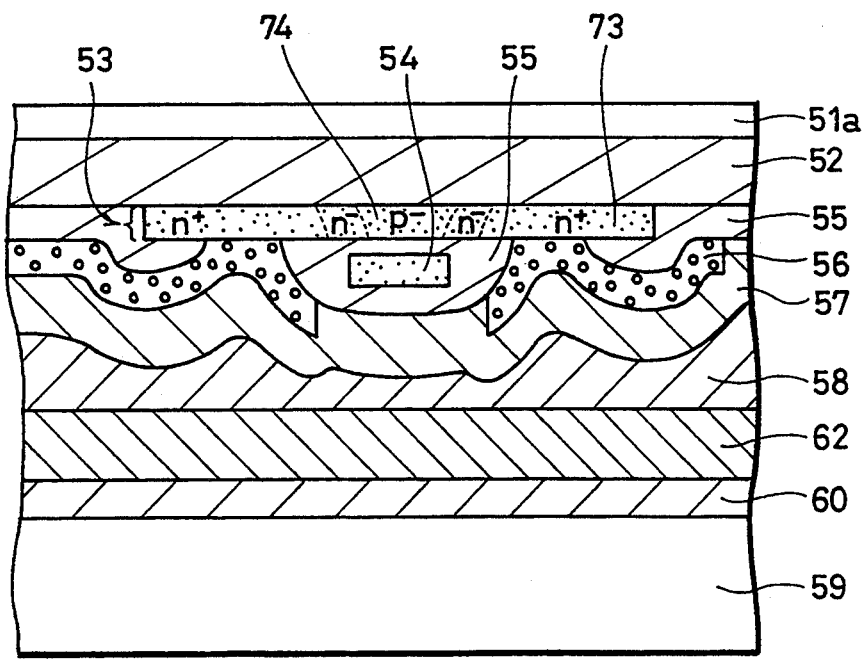

The bottom surface (the other main surface) of first semiconductor substrate 51 is then ground as far as the broken line in FIG. 8 by rigid grinding to form a second semiconductor layer 51a in the order of 1000 Å as shown in FIG. 9.

Figure 10:
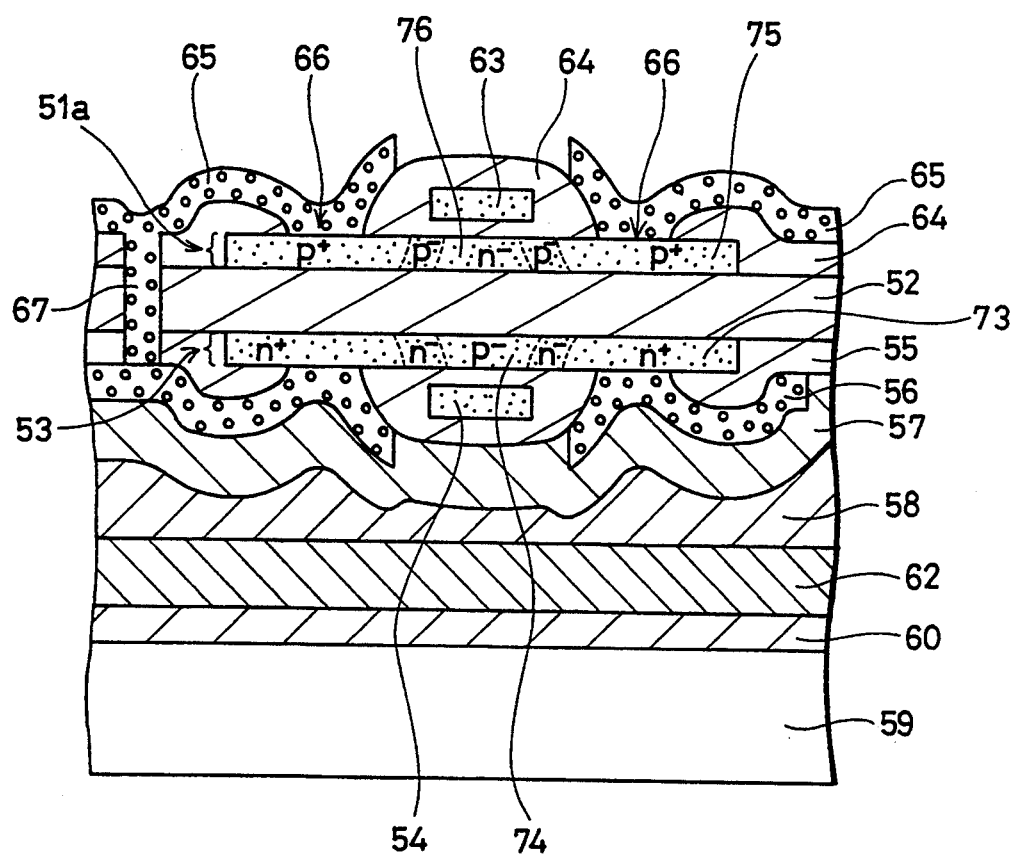

Referring to FIG. 10, the second semiconductor layer 51a is patterned by photolithography and etching and, furthermore, a gate electrode 63 and an insulation oxide film 64 are formed. Thereafter, a contact hole 66 for the second semiconductor layer 51a and a contact hole 67 for conductive interconnection 56 of the previously formed nMOSFET are made. Then, a pMOSFET is formed on the second semiconductor layer 51a, and furthermore, a conductive interconnection 65 formed of aluminum or the like is provided. The pMOSFET and the nMOSFET are electrically connected to each other through contact hole 67.

As described above, in accordance with this embodiment, the substrates are stuck together by taking advantage of the chemical reaction between refractory metal layer 61 and polycrystalline silicon layer 58. This chemical reaction is caused at about 650° C., which is lower than in the background art method of joining the substrates. Such a degree of temperature does not cause electrically active impurities doped in the device to diffuse again. Therefore, a stacked-type semiconductor integrated circuit can be made without degrading the characteristics of a device which has already been formed.

Although tungsten is used as the refractory metal in the embodiment above, the polycrystalline silicon may be stuck on another tungsten silicide ($W_xSi_y$: $y/x<2$) including less silicon than the chemical equivalent of the tungsten silicide ($WSi_2$) used in the above embodiment. In this case, silicon atoms move from the polycrystalline silicon to get combined with the another tungsten silicide so that it is changed to the tungsten silicide ($WSi_2$) of the chemical equivalent by subsequent thermal treatment (including the thermal treatment in forming the device), and, as a result, the substrates are joined together.

Furthermore, any refractory metal may be used as far as it is silicidized at 700° C. or below and the melting point of the refractory metal silicide higher than the semiconductor process temperature. Table 1 shows melting points and formation temperatures of various refractory metal silicides.

TABLE 1

Melting points and formation temperatures of various refractory metal silicides

| Substance | Melting point (°C.) | Silicide formation temperature (°C.) |
| --- | --- | --- |
| $TiSi_2$ | 1540 | 600 |
| $VSi_2$ | 1670 | 600 |
| $CrSi_2$ | 1550 | 450 |
| $ZrSi_2$ | 1650 | 700 |
| $NbSi_2$ | 1950 | 650 |
| $MoSi_2$ | 1980 | 525 |
| $HfSi_2$ | 1800 | 700 |
| $TaSi_2$ | 2200 | 650 |
| $WSi_2$ | 2165 | 650 |

For each substance above, since silicide is formed at a temperature of about 600° C. and its melting point is higher than the temperature in the range of 900° C. to 1000° C. which is used in the semiconductor processes, it is possible to stick together substrates having devices formed thereon, using these substances indicated above.

As a matter of course, according to this method, it is also possible to stick together substrates having no device formed thereon. Furthermore, although the polycrystalline silicon film is provided over the first substrate 51 having the device formed thereon in this embodiment, a refractory metal layer may be provided over the first semiconductor substrate 51 and a polycrystalline silicon layer may be provided over the second semiconductor substrate 59.

Though the single crystalline silicon substrate is used as the supporting substrate in the embodiment above, any substance that withstands the semiconductor process temperature (in the order of 900° C. to 1000° C.) after the joining, for example, quartz (pure $SiO_2$) substrate, may be used. Furthermore, although the pMOSFET is formed after the nMOSFET in the embodiment above, the order of formation may be reversed. Additionally, the same effects can be achieved as long as the device to be formed is a semiconductor element such as a bipolar transistor.

Figure 27:
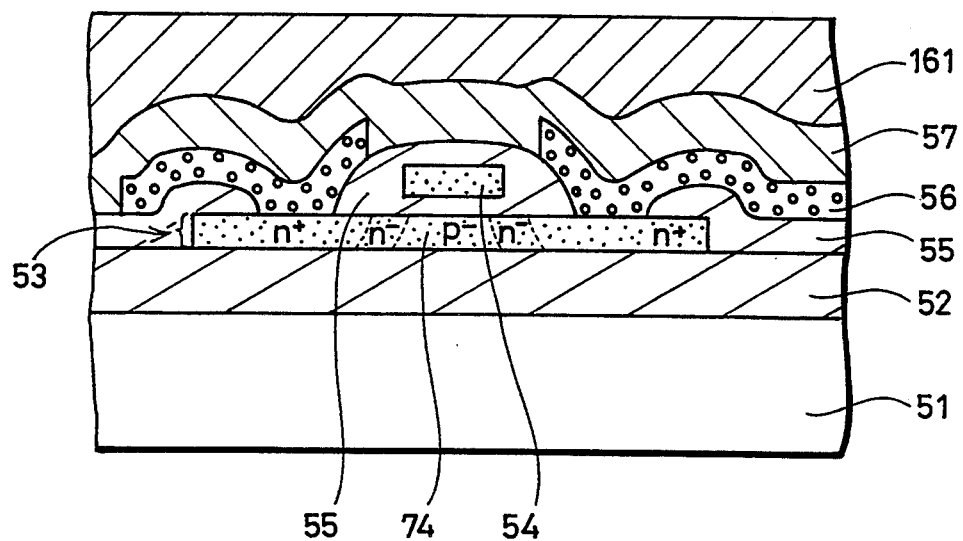
FIGS. 27, 28, 29, and 30 are cross-sectional views showing in order each process in a method of manufacturing a stacked-type semiconductor device having a portion modified of the first embodiment.
Figure 28:
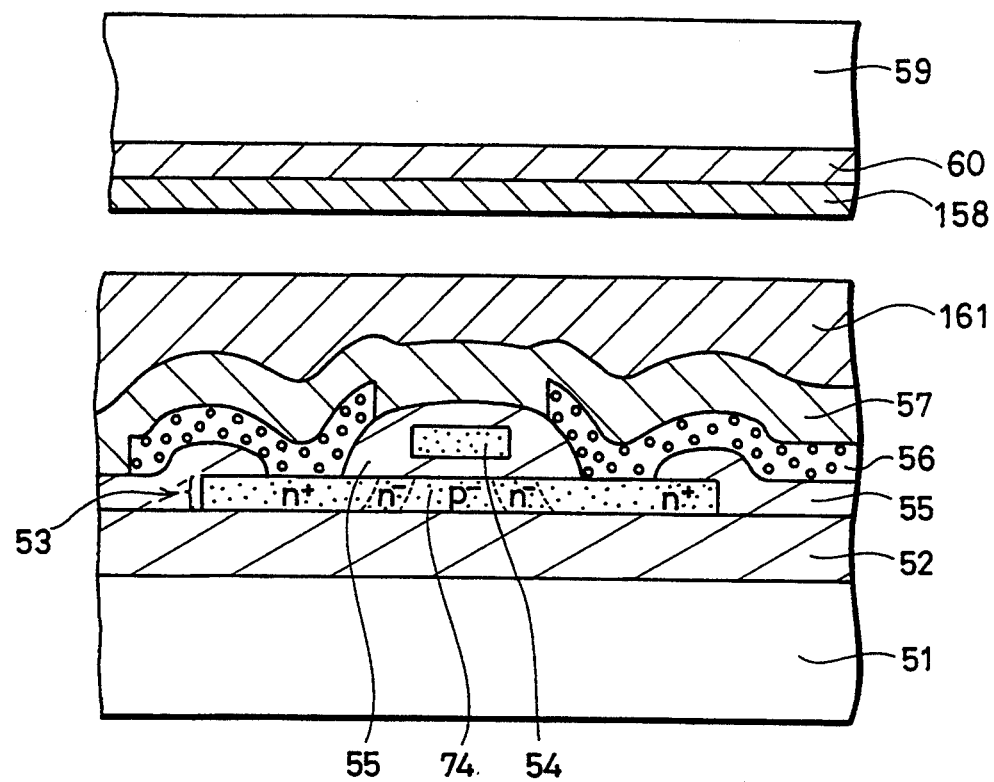
Figure 29:
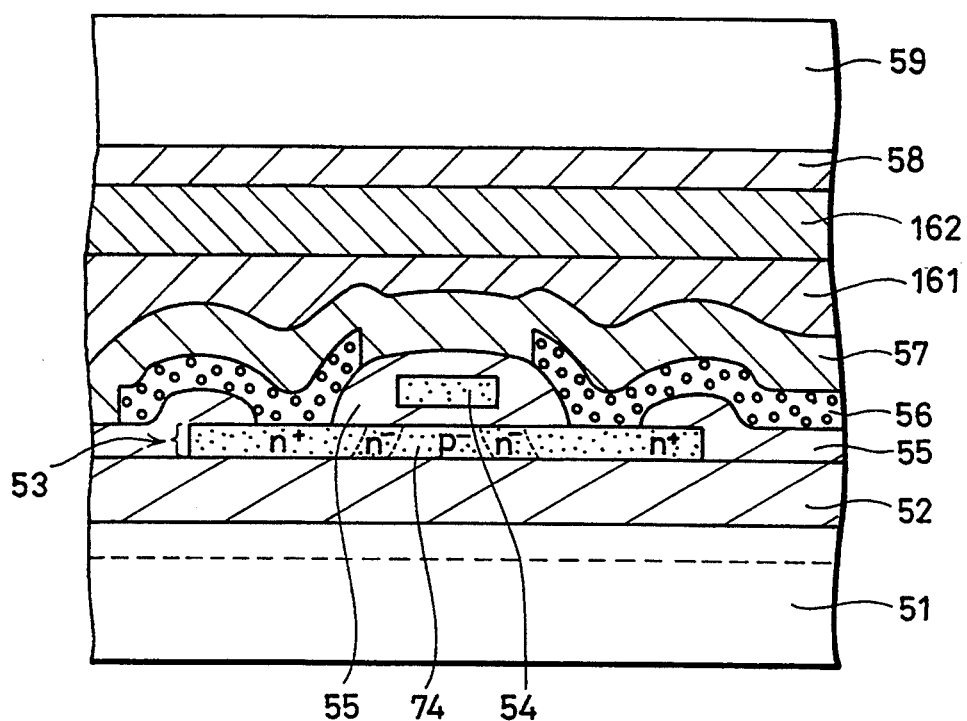
Figure 30:
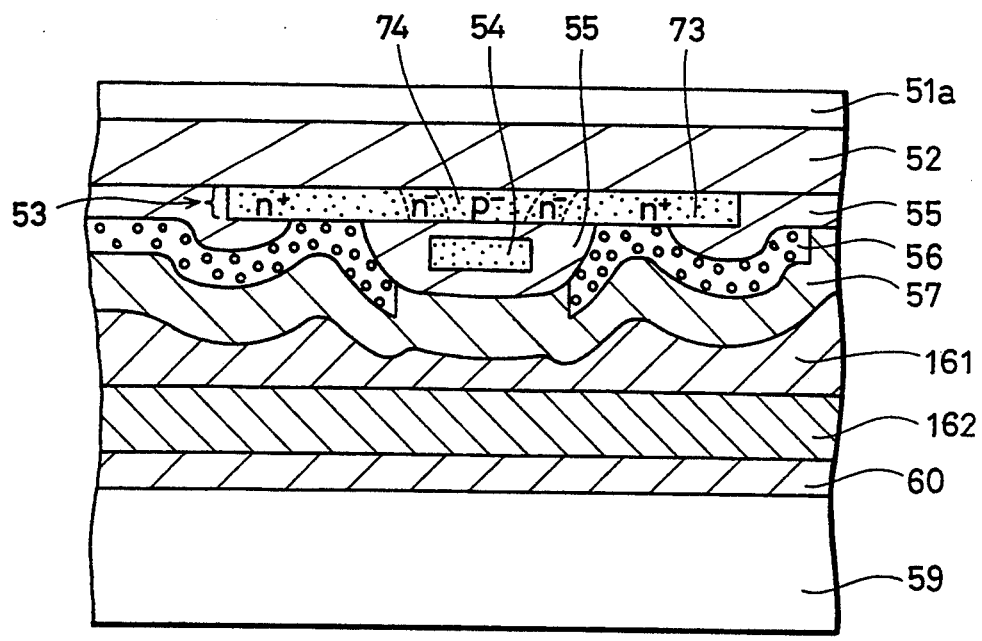
Figure 31:
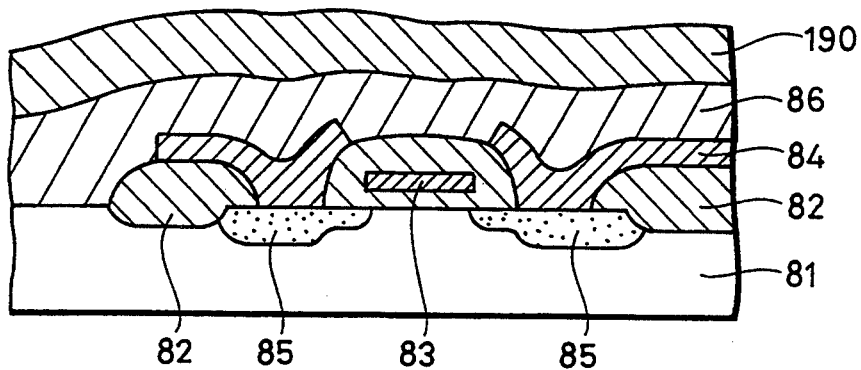
FIGS. 31, 32, 33, and 34 are cross-sectional views showing in order each process in a method of manufacturing a stacked-type semiconductor device having a portion modified of the third embodiment.

In the present method, after the step of FIG. 5, a refractory metal layer 161 is formed on the surface of interlayer insulation layer 57 to have its surface planarized by rigid grinding (FIG. 27). Then, a second semiconductor substrate 59 having a polycrystalline silicon layer 58 formed on a main surface with an oxide film 60 therebetween is moved as shown in FIG. 28 so that the surface of polycrystalline silicon layer 58 and the planarized surface of refractory metal layer 61 are adhered to each other. Under this condition, thermal treatment is carried out for twenty minutes at 650° C. in a nitride atmosphere to generate silicide reaction between polycrystalline silicon layer 158 and refractory metal layer 161, whereby a refractory metal silicide layer 162 is formed as shown in FIG. 29. Then, the first semiconductor substrate 51 is ground up to the position shown in the broken line in FIG. 29 to result in the structure shown in FIG. 30. According to the present method, a stacked-type semiconductor device having a structure similar to that of FIG. 10 can be obtained.

While the above-described processes of forming the pMOSFET and the nMOSFET are similar to each other, they differ in the following respects.

Arsenic is implanted into the polycrystalline silicon of gate electrode 63 with 50 KV and $5 \times 10^{15}/cm^2$ to make gate electrode 63 of the n conductivity type. Then, boron is implanted into second semiconductor layer 51a with 20 KV and $1\times 10^{13}/cm^2$ to form a p⁻ region and provide spacers on sidewalls of gate electrode 63. Thereafter, boron is implanted with 20 KV and $5\times 10^{14}/cm^2$ to form a p⁺ region. Contact hole 66 and so on are made, furthermore, aluminum is deposited by sputtering, having 10000 Å and patterned to form conductive interconnection 65, so that the pMOSFET is completed.

Figure 1:
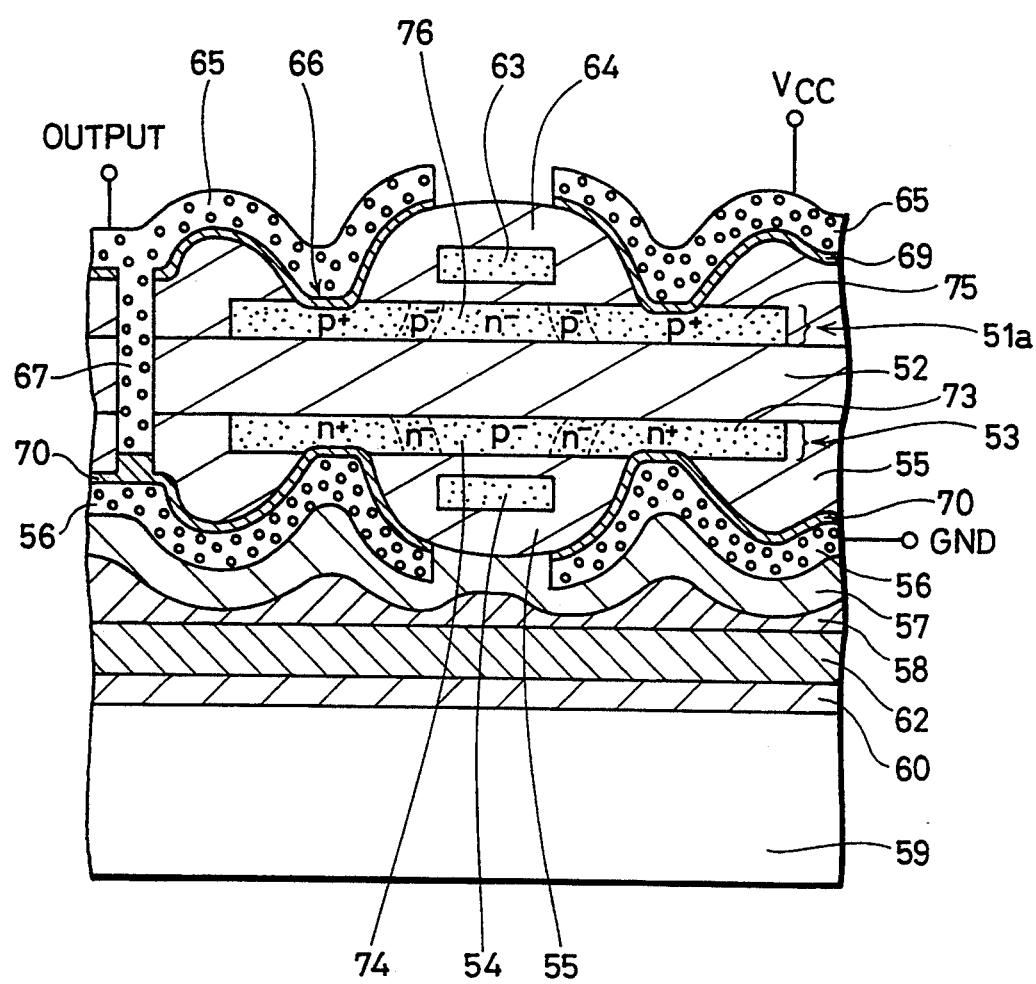
FIG. 1 is a cross-sectional view of a CMOSFET formed by a method of manufacturing a stacked-type semiconductor device according to a first embodiment of the present invention (cross-sectional view taken along the line I—I in FIG. 2).
Figure 2:
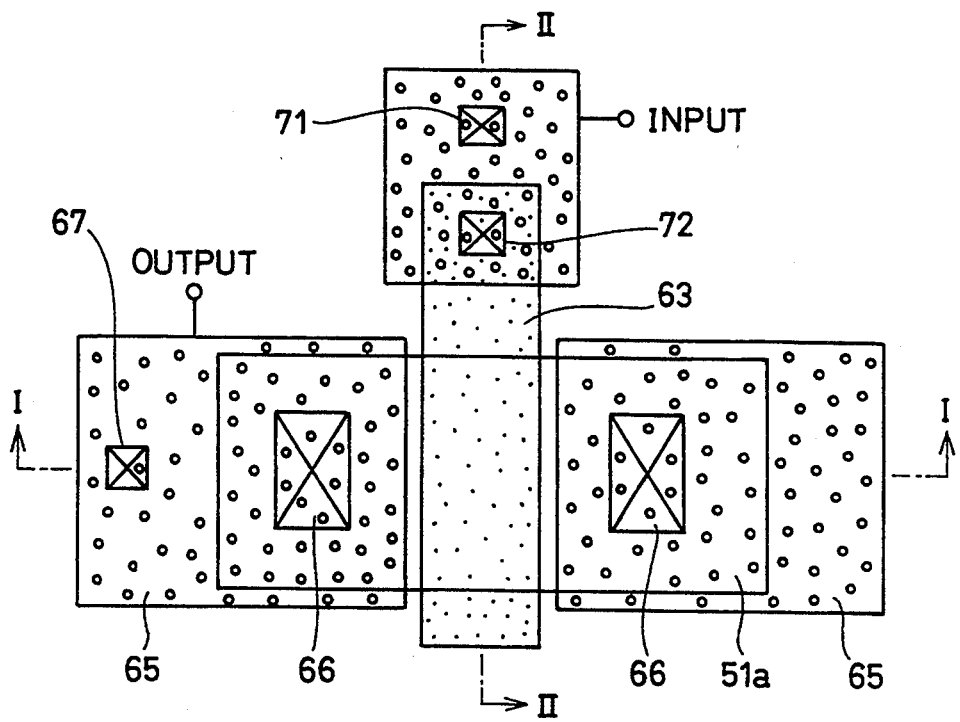
FIG. 2 is a plan view of the CMOSFET shown in FIG. 1.
Figure 3:
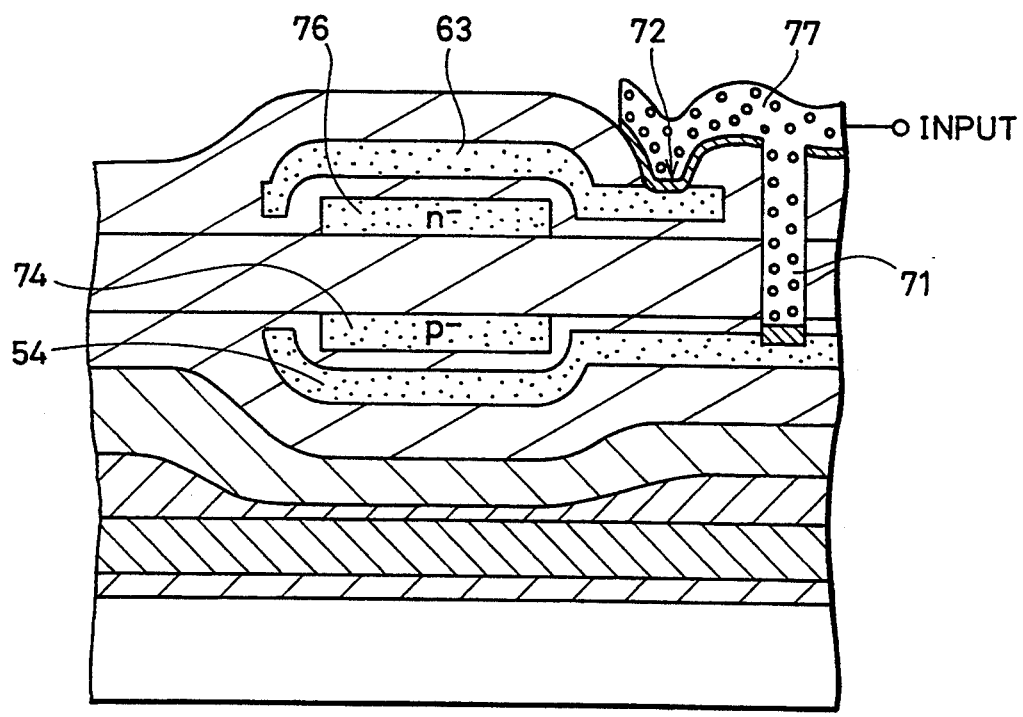
FIG. 3 is a cross-sectional view taken along the line II—II in FIG. 2.
Figure 4:
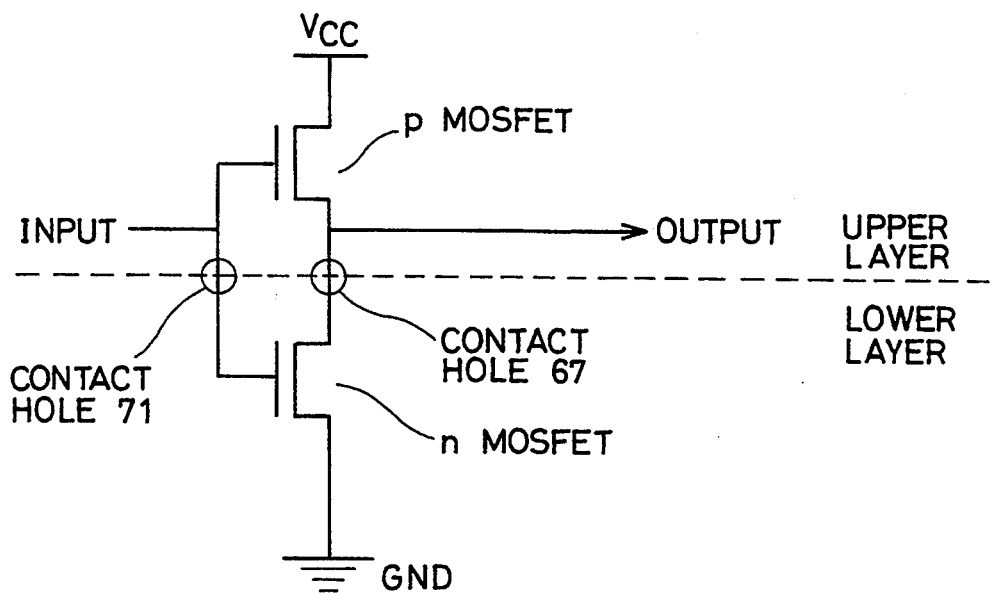
FIG. 4 is an equivalent circuit diagram of the CMOSFET shown in FIGS. 1 to 3.

Thus formed stacked-type semiconductor device constitutes a CMOSFET. FIGS. 1 to 3 show the CMOSFET in detail. FIG. 4 shows an equivalent circuit of the CMOSFET.

While conductive interconnections 56 and 65 are formed of aluminum by sputtering in FIGS. 5 to 10, they are formed of refractory metal silicide or the like in the CMOSFET shown in FIGS. 1 to 3. FIGS. 2 and 3 show a contact hole 71 for a conductive interconnection 77 connected to an input terminal and a gate electrode 54 and a contact hole 72 for a conductive interconnection 77 and a gate electrode 63. A description will now be made of a process of forming a conductive interconnection 65 on the upper layer side shown in FIGS. 1 to 3.

Firstly, a contact hole 66 having a diameter of 1 μm is apertured in an insulation oxide film 64 on a second semiconductor layer 51a. After that, titanium is deposited by sputtering to have a thickness of 500 Å and annealing is carried out by an infrared ray lamp heating furnace in an atmosphere of nitrogen at 800° C. for 60 seconds. This treatment changes the titanium in contact with the single crystalline silicon to titanium silicide (TiSi₂) and other titanium is changed to titanium nitride (TIN). Furthermore, tungsten silicide (WSi₂) is deposited by sputtering to have a thickness of 3000 Å. The titanium nitride and the tungsten silicide are patterned to form a barrier metal layer 69 and conductive interconnection 65. In this case, the titanium silicide is formed for providing an ohmic contact between source/drain region 75 and conductive interconnection 65. The titanium nitride serves as a barrier metal for preventing diffusion of the impurities implanted in the second semiconductor layer 51a into conductive interconnection 65. A conductive interconnection 56 and a barrier metal layer 70 can be formed of the same materials and in the same processes as conductive interconnection 65 and barrier metal layer 69.

As described above, in accordance with this embodiment, since the process of joining the first semiconductor substrate and the second semiconductor substrate is carried out at a relatively low temperature of 700° C. or below, degradation of the device characteristics due to the thermal treatment can be avoided.

Also, in the first photolithography process for the pMOSFET in the upper layer, as the second semiconductor layer 51a is only 1000 Å thick, the helium neon laser beam is fully transmitted through the layer, reaching a mask alignment pattern (not shown) formed in the lower nMOSFET layer. The helium neon laser beam reflected from the mask alignment pattern is strong enough to be detected even after it is transmitted through the second semiconductor layer 51a. Accordingly, it is possible to make a contact hole having a diameter in the approximate range of 0.8 to 1 μm with a mask alignment accuracy of ±0.3 μm and elements of high density can be manufactured using a reduced projection exposing apparatus which gives the highest resolution and positional accuracy at present.

A second embodiment according to the present invention will now be described.

According to the second embodiment, a silicon nitride film ($Si_xN_y$: y/x is at least 1.33 and preferably 1.4) containing a larger amount of nitrogen than the chemical equivalent ($Si_3N_4$), instead of refractory metal layer 61, is formed over a main surface of a second semiconductor substrate 59 to have a thickness of 1000 Å with an insulating layer 60 interposed therebetween. This silicon nitride film is deposited by ECR (Electron Cyclotron Resonance)-CVD. The depositing temperature is in the order of 100° C. The surface of the silicon nitride film layer of the second semiconductor substrate 59 formed in this way is put face to face with and in close contact with a planarized surface of a polycrystalline silicon layer 58 of a first semiconductor substrate 51 and both of them are heated in an atmosphere of nitrogen at 700° C. or below. The silicon nitride film ($Si_xN_y$) absorbs silicon atoms from polycrystalline silicon layer 58 in order to attain a composition of the chemical equivalent. This chemical reaction enables to join the first semiconductor substrate 51 and the second semiconductor substrate 59 together. Other processes are the same as those in the first embodiment above.

According to the manufacturing method of this embodiment, since the first semiconductor substrate 51 and the second semiconductor substrate 59 can be joined together by thermal treatment at a relatively low temperature of 700° C. or below, an adverse effect of the heat on the first device formed in the previous process can be avoided.

Although a silicon nitride film is formed at the side of the second semiconductor substrate 59 and a polycrystalline silicon layer 58 is formed at the side of the first semiconductor substrate 51 in the present embodiment, a same effect can be obtained by forming a planarized silicon nitride film at the side of the first semiconductor substrate 51, and a polycrystalline silicon layer at the side of second semiconductor substrate 59 to be bonded together.

A third embodiment according to the present invention will now be described with reference to FIGS. 11 to FIG. 15.

This embodiment can be compared with the second example of the background art described before and relates to a manufacturing method where another device is stacked over a semiconductor substrate having a device already formed thereon.

Figure 11:
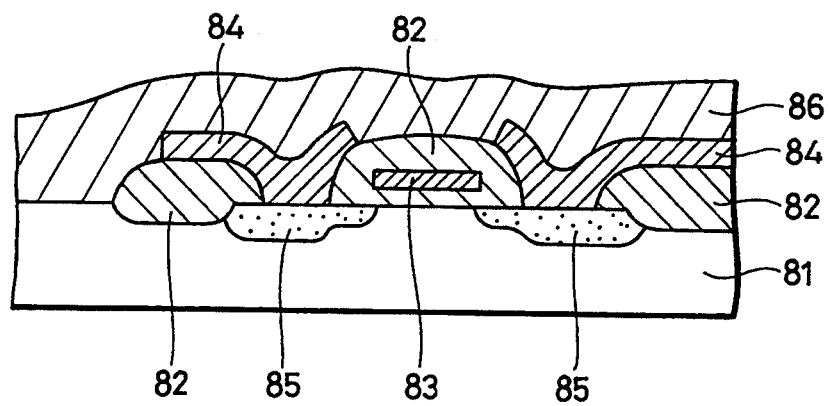
FIGS. 11, 12, 13, 14, 15 and 16 are cross-sectional views showing in order each process in a method of manufacturing a stacked-type semiconductor device according to a third embodiment of the present invention.
Figure 12:
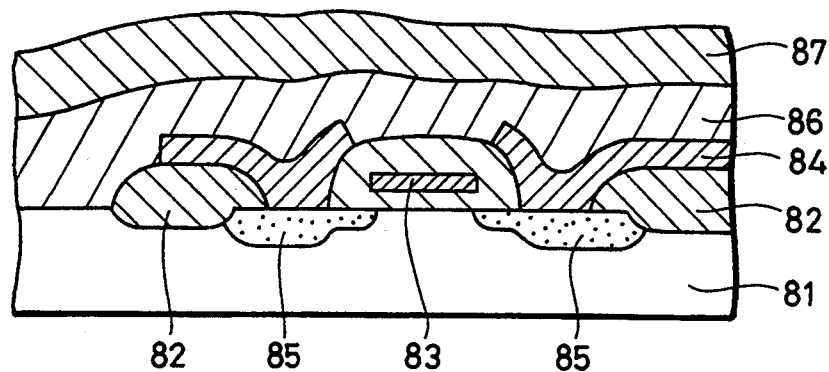
Figure 13:
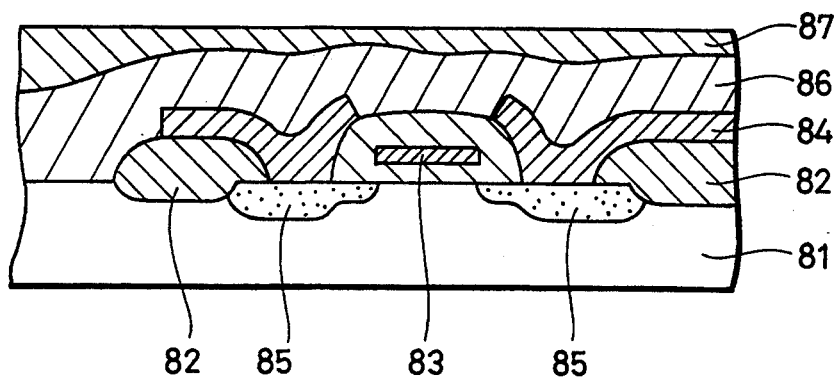

In this embodiment, referring to FIG. 11, firstly, a MOSFET serving as a first device is provided on a first semiconductor substrate 81 formed of single crystalline silicon, including an insulation oxide film 82, a gate electrode 83, a conductive interconnection 84 and source/drain regions 85. This MOSFET is covered with an interlayer insulating layer 86 having a thickness of about 5000 Å by CVD and, furthermore, a polycrystalline silicon layer 87 is formed also by CVD to have a thickness of about 1 μm (see FIG. 12). Thereafter, the upper surface of polycrystalline silicon layer 87 is planarized by rigid grinding (see FIG. 13).

Figure 14:
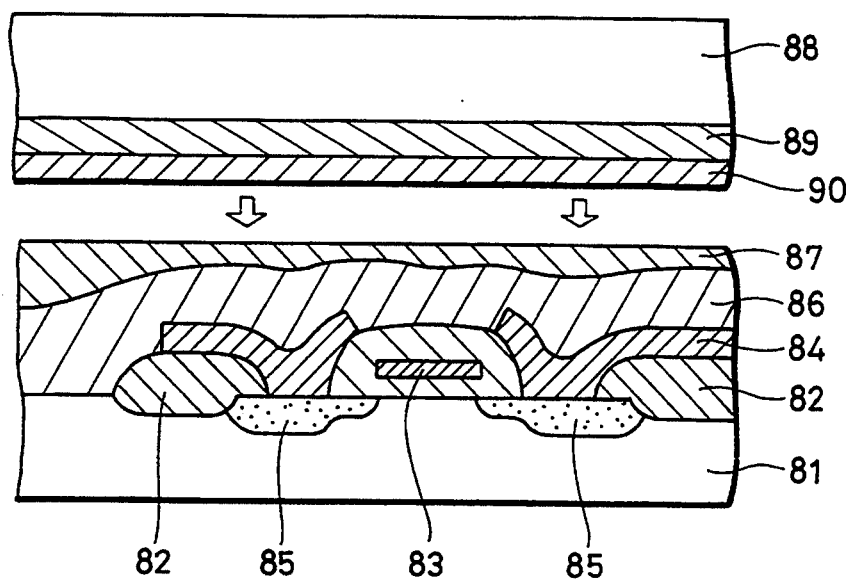

A refractory metal layer 90 formed of tungsten or the like is deposited over a main surface of a second semiconductor substrate 88 formed of single crystalline silicon to have a thickness of about 3000 Å by sputtering with an insulating layer 89 interposed therebetween. Thereafter, as shown in FIG. 14, the surfaces of refractory metal layer 90 and polycrystalline silicon layer 87 are put face to face and in close contact with each other.

Figure 15:
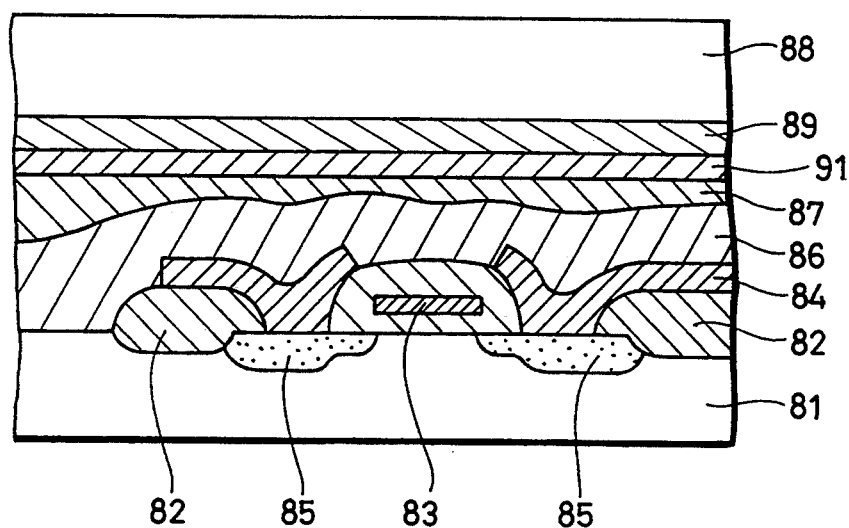

Subsequently, thermal treatment in an atmosphere of nitrogen at 650° C. for 20 minutes is carried out to cause reaction between polycrystalline silicon layer 87 and refractory metal layer 90 to change refractory metal layer 90 to a refractory metal silicide layer 91 so that they are joined together (see FIG. 15).

Figure 16:
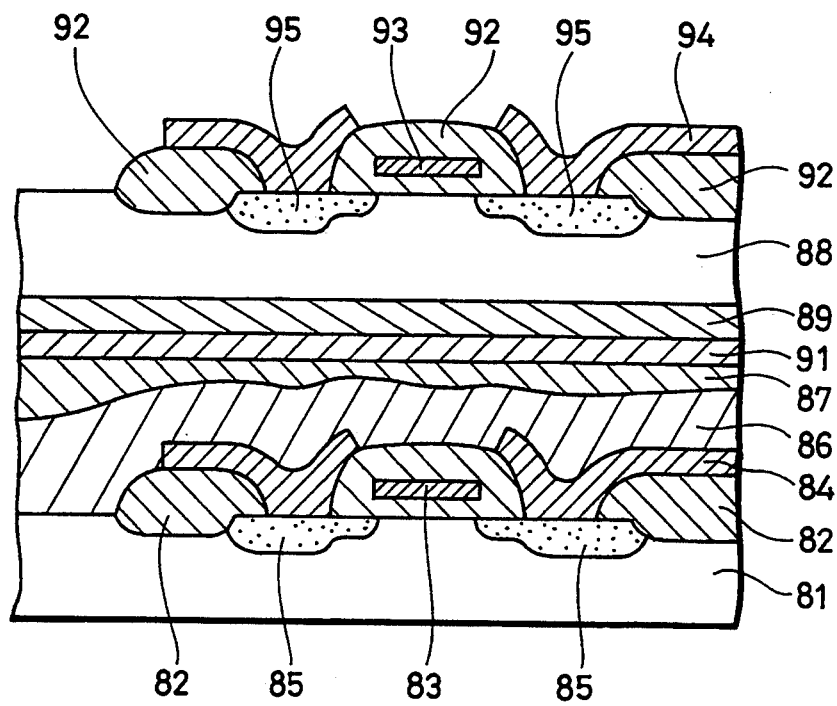
Figure 17:
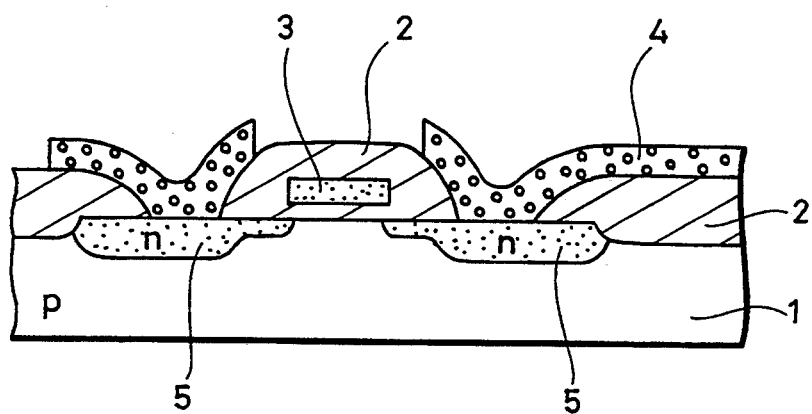
FIGS. 17, 18, 19, 20 and 21 are cross-sectional views showing in order each process in a method of manufacturing a stacked-type semiconductor device according to a first example of the background art.
Figure 18:
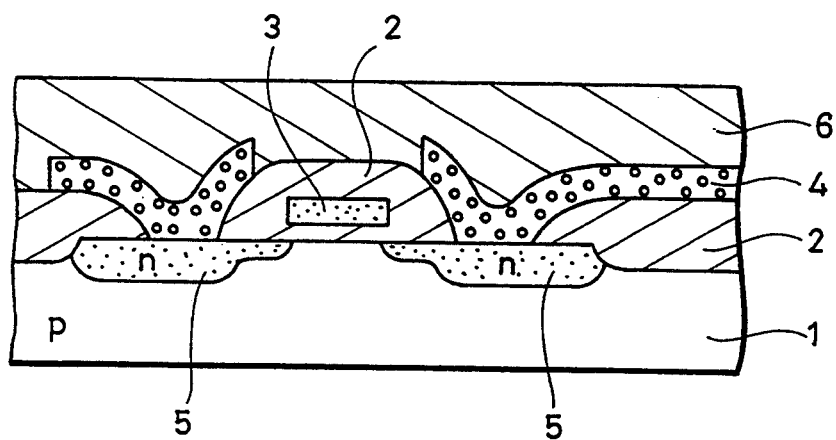
Figure 19:
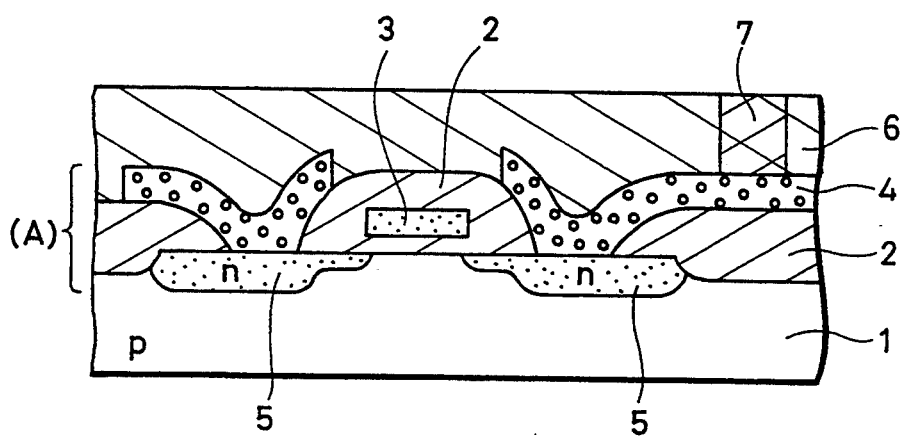
Figure 20:
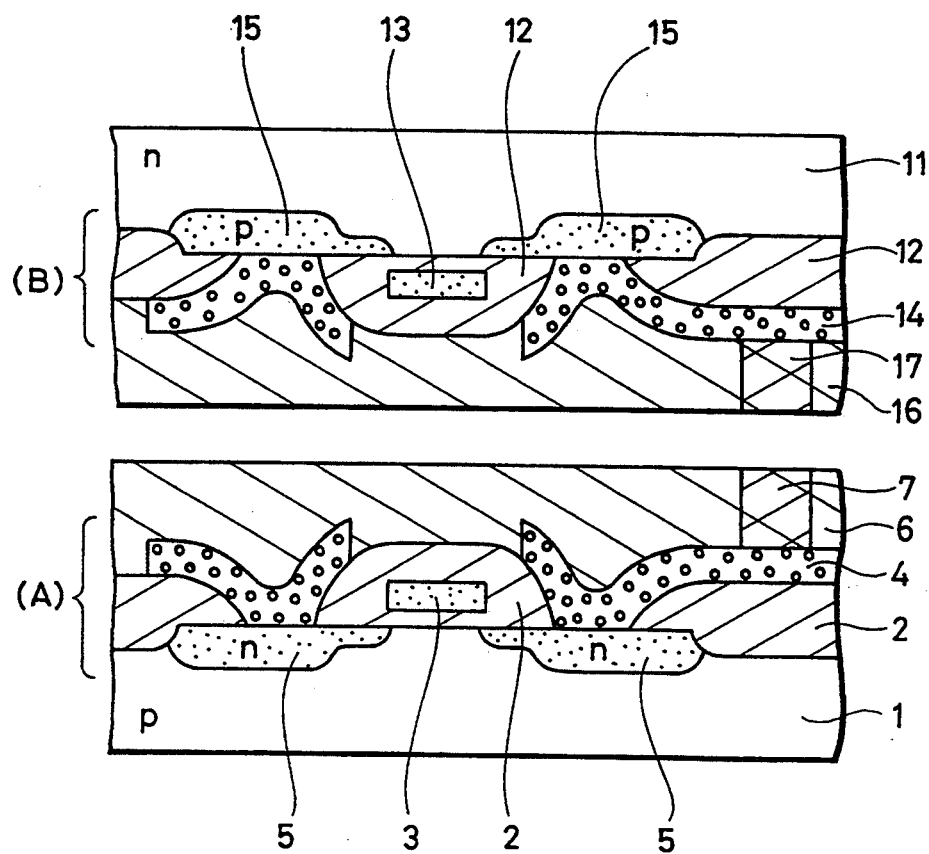
Figure 21:
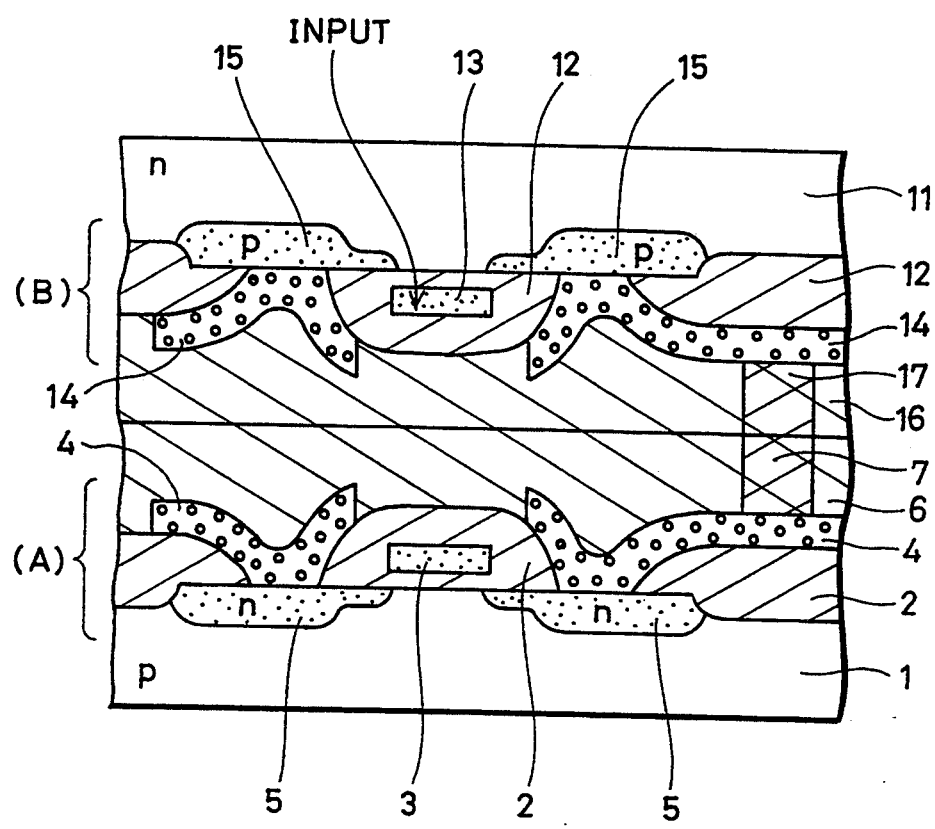
Figure 22:
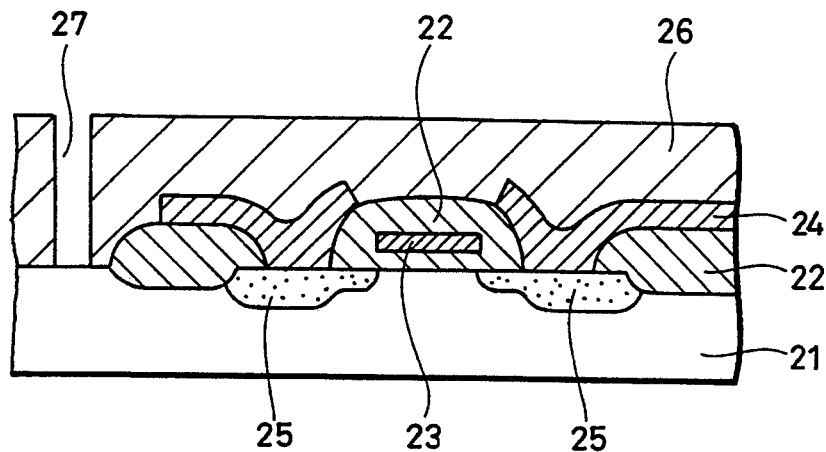
FIGS. 22, 23, 24, 25 and 26 are cross-sectional views showing in order each process in a method of manufacturing a stacked-type semiconductor device according to a second example of the background art.
Figure 23:
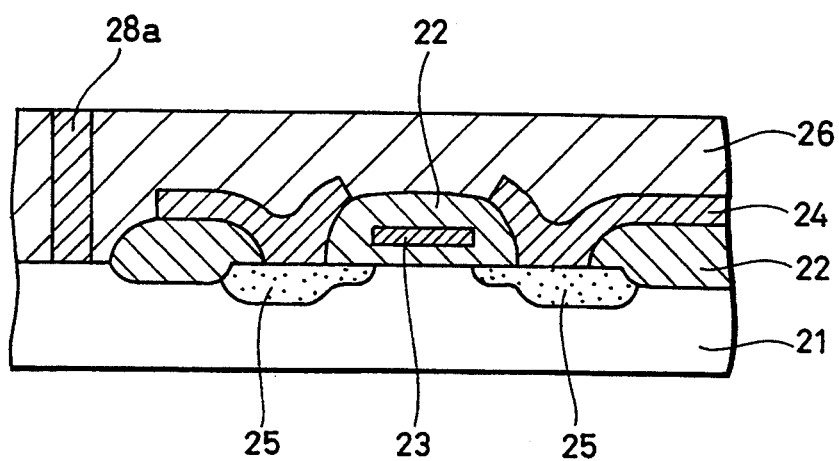
Figure 24:
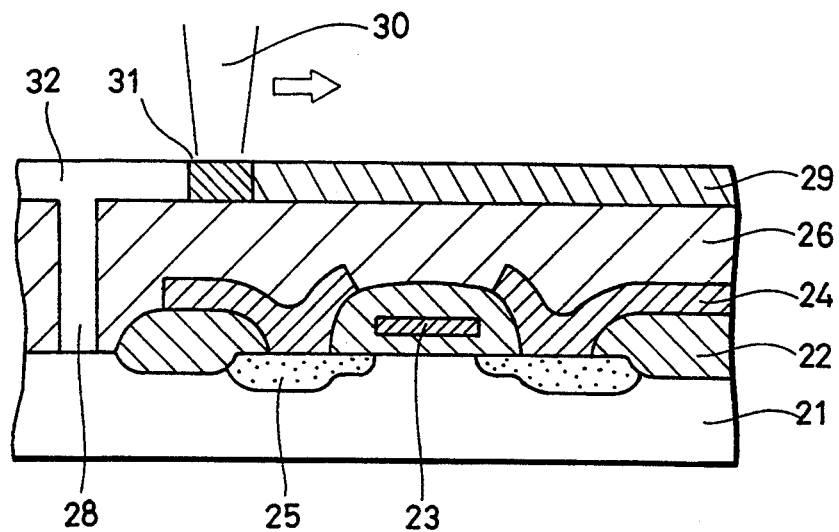
Figure 25:
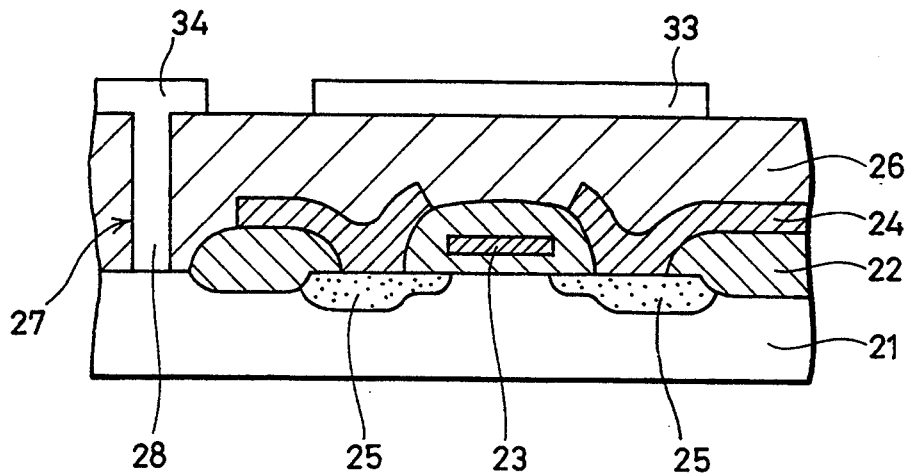
Figure 26:
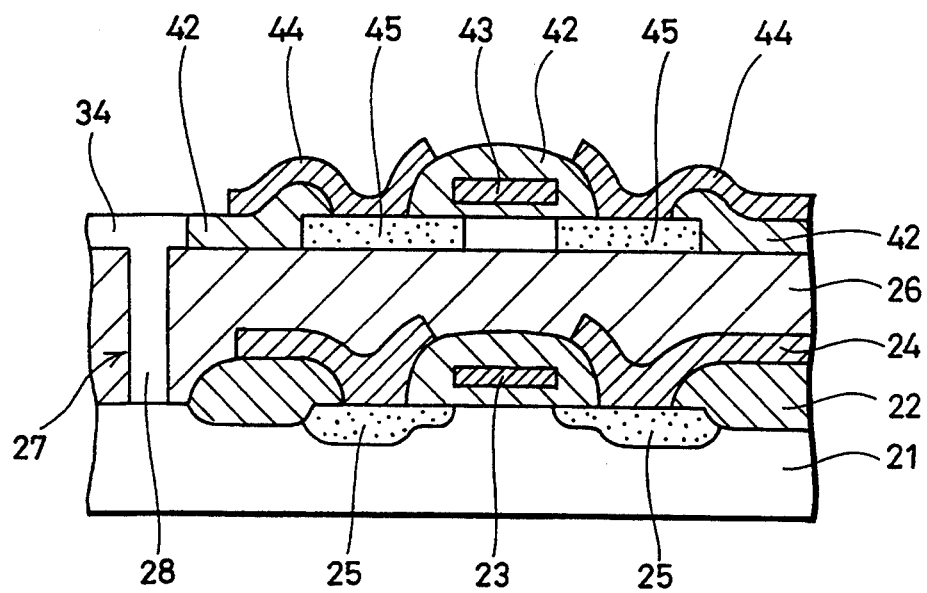

Then, a second device is formed on a main surface on the opposite side of insulating layer 89 of the second semiconductor substrate 88 as shown in FIG. 16. The second device includes an insulation oxide film 92, a gate electrode 93, a conductive interconnection 94 and source/drain regions 95.

In accordance with this embodiment, since the first semiconductor substrate and the second semiconductor substrate can be joined together by the thermal treatment at a relatively low temperature of 700° C. or below, an adverse effect on the first device already formed in the previous process can be avoided. Accordingly, this manufacturing method can provide a device having a structure where a plurality of layers are stacked up without degrading the device characteristics.

Although the planarized polycrystalline silicon layer 87 and refractory metal layer 90 are put in close contact with each other to be joined together in this embodiment, of course, the same effects can be achieved by depositing a silicon nitride film, instead of refractory metal layer 90, containing a larger amount of nitrogen than the chemical equivalent ($Si_3N_4$) and applying the same thermal treatment as in the second embodiment described above.

Figure 32:
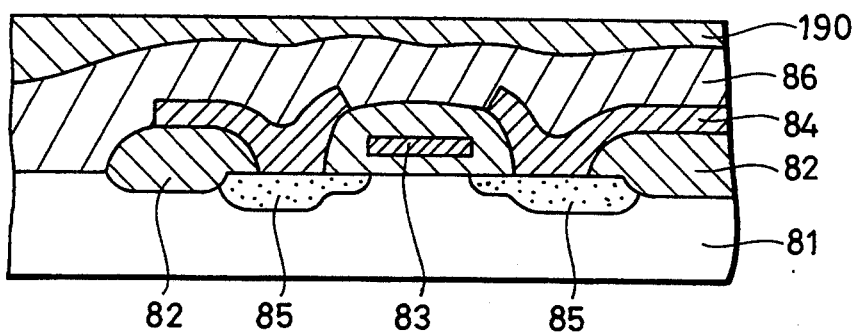
Figure 33:
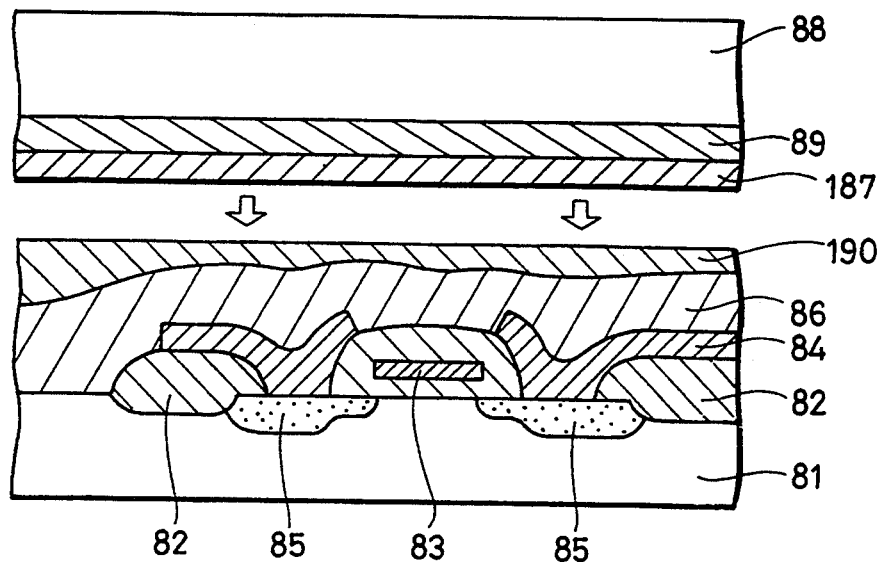
Figure 34:
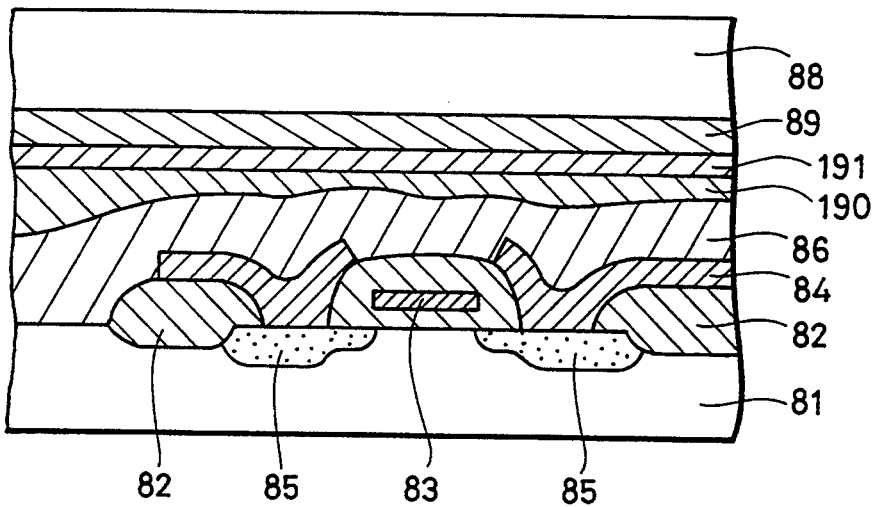

Although the present embodiment has a planarized polycrystalline silicon layer 87 formed at the side of the first semiconductor substrate 81, and a refractory metal layer 90 formed at the side of the second semiconductor substrate 88, the steps shown in FIGS. 31–34 are also possible. In this method, after the step of FIG. 11, refractory metal layer 190 is formed on the surface of interlayer insulating film 86 (FIG. 31), whereby the surface is planarized by rigid grinding (FIG. 32). Then, a second semiconductor substrate 88 having a polycrystalline silicon layer 187 formed on the main surface with an oxide film 89 therebetween is moved to the surface of refractory metal layer 190 shown in FIG. 33 to adhere the surface of polycrystalline silicon layer 187 to the surface of refractory metal layer 190. Under this state, thermal treatment is applied for twenty minutes at 650° C. in nitride atmosphere to generate silicide reaction between polycrystalline silicon layer 187 and refractory metal layer 190 to form refractory metal silicide layer 191 as shown in FIG. 34. This method can also result in the structure similar to that shown in FIG. 16.

Because it is possible to bind together semiconductor substrates at a relatively low temperature of not more than 700° C. so that characteristic degradation will not be generated in the device formed on the semiconductor substrate in the above embodiments, there are the following advantages in the formation of a CMOS (Complementary Metal Oxide Semiconductor), for example. More specifically, it is possible to form an n channel MOSFET at one side and a p channel MOSFET at the other side sandwiching an insulating layer. Therefore, the steps of photolithography and impurity implantation are simplified and the integration density increased in comparison with the case of implementing a CMOS having both formed on a main surface of a semiconductor substrate. This is because only a MOSFET of one conductivity type can be formed in number on the main surface of one semiconductor substrate, in which the area occupied by the n channel MOSFET and the p channel MOSFET after being bound is approximately a half of the case where both are formed on the main surface of a semiconductor substrate.

As stated above, in accordance with the present invention, since the semiconductor substrates are joined together by thermal treatment of a relatively low temperature taking advantage of chemical reaction such as silicidation, a stacked-type semiconductor device can be manufactured without causing an adverse effect of heat on a device formed in the previous process.

Additionally, with thus stuck second semiconductor substrate serving as a supporting substrate, the back surface of the first semiconductor substrate is polished and has a second device formed thereon, so that aligning using the helium neon laser beam as a probe beam is made possible and a stacked-type semiconductor device with high integration density can be manufactured.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A stacked-type semiconductor device comprising:
 a supporting substrate having a main surface;
 a refractory metal silicide layer on said main surface of said supporting substrate, said refractory metal silicide layer having an upper surface and a lower surface facing said main surface;
 a silicon layer on said upper surface of said refractory metal silicide layer, said silicon layer having an upper surface and a lower surface facing said upper surface of said refractory metal silicide layer;
 a first semiconductor layer on said upper surface of said silicon layer, said first semiconductor layer having an upper surface and a lower surface facing said upper surface of said silicon layer; and
 a second semiconductor layer on said upper surface of asid first semiconductor layer with an insulating layer interposed therebetween,
 wherein said second semiconductor layer has an upper surface and a lower surface, and said lower surface of said first semiconductor layer and said upper surface of said second semiconductor layer each has at least one electronic device formed thereon.

2. A stacked-type semiconductor device according to claim 1, wherein said supporting substrate comprises a silicon substrate.

3. A stacked-type semiconductor device according to claim 1 1, wherein said supporting substrate comprises a quartz substrate.

4. A stacked-type semiconductor device according to claim 1, further comprising an insulating film interposed between said silicon layer and said first semiconductor layer.

5. A stacked-type semiconductor device according to claim 1, wherein at least one of said first and second semiconductor layers is a silicon layer.

6. A stacked-type semiconductor device comprising:
 a supporting having a main surface;
 a silicon nitride layer on said main surface of said supporting substrate, said silicon nitride layer having an upper surface and a lower surface facing said main surface;

a silicon layer on said upper surface of said silicon nitride layer, said silicon layer having an upper surface and a lower surface facing said upper surface of said silicon nitride layer;

a first semiconductor layer on said upper surface of said silicon layer, said first semiconductor layer having an upper surface and a lower surface facing said upper surface of said silicon layer; and a second semiconductor layer on said upper surface of said first semiconductor layer with an insulating layer interposed therebetween, said second semiconductor layer having an upper surface and a lower surface, wherein said lower surface of said first semiconductor layer and said upper surface of said second semiconductor layer each has at least one electronic device formed thereon.

7. A stacked-type semiconductor device according to claim 6, wherein said supporting substrate comprises a silicon substrate.

8. A stacked-type semiconductor device according to claim 6, wherein said supporting substrate comprises a quartz substrate.

9. A stacked-type semiconductor device according to claim 6, further comprising an insulating film interposed between said silicon layer and said first semiconductor layer.

10. A stacked-type semiconductor device according to claim 6, wherein at least one of said first and second semiconductor layers is a silicon layer.

* * * * *